United States Patent
Thelen et al.

(10) Patent No.: US 8,471,644 B2
(45) Date of Patent: Jun. 25, 2013

(54) DIGITAL AUTOMATIC GAIN CONTROL CIRCUITS AND METHODS FOR CONTROLLING THE AMPLITUDE OF A TIME-VARYING SIGNAL

(75) Inventors: Robert Thelen, Fort Collins, CO (US); Herman H. Pang, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 246 days.

(21) Appl. No.: 13/009,471

(22) Filed: Jan. 19, 2011

(65) Prior Publication Data

US 2012/0183105 A1    Jul. 19, 2012

(51) Int. Cl.
*H03L 5/00* (2006.01)

(52) U.S. Cl.
USPC .............................. 331/183; 331/109; 331/182

(58) Field of Classification Search
USPC ................... 331/25, 117 R, 167, 177 R, 182, 331/183, 109
See application file for complete search history.

(56) References Cited

U.S. PATENT DOCUMENTS

| | | | |
|---|---|---|---|
| 5,955,925 A | 9/1999 | Segawa et al. | |
| 5,991,106 A | 11/1999 | Ohmori | |
| 6,404,294 B1 | 6/2002 | Sha et al. | |
| 6,680,655 B2 * | 1/2004 | Rogers | 331/109 |
| 6,904,274 B2 | 6/2005 | Simmons et al. | |
| 7,026,883 B2 * | 4/2006 | Muthali et al. | 331/183 |
| 7,689,217 B2 | 3/2010 | Ruelke et al. | |
| 7,829,230 B2 * | 11/2010 | Berning et al. | 429/433 |
| 2003/0092412 A1 | 5/2003 | Wu | |
| 2004/0075462 A1 * | 4/2004 | Kizer et al. | 326/29 |
| 2004/0135608 A1 * | 7/2004 | Pillay et al. | 327/175 |

OTHER PUBLICATIONS

Margarit, Mihai A., A Low-Noise, Low-Power VCO with Automatic Amplitude Control for Wireless Applications, IEEE Journal of Solid State Circuits, vol. 34, No. 6, Jun. 1999, pp. 761-771.
Rosu, Julian, Automatic Gain Control (AGC) in Receivers, available at http://www.qsl.net/va3iul/.

* cited by examiner

*Primary Examiner* — Joseph Chang
*Assistant Examiner* — Jeffrey Shin

(57) ABSTRACT

A gain control circuit, suitable for controlling the amplitude of a voltage-controlled oscillator, includes a duty cycle detector, an analog-to-digital converter, and a function generator. The gain control circuit provides a digitally enabled negative feedback loop. The duty cycle detector generates an estimate of the amplitude. The function generator receives a target amplitude as well as a digital representation of the estimate of the amplitude. The function generator calculates a modified estimate and periodically compares the same to the target value to generate a control word. The control word is arranged to enable current sources in the voltage-controlled oscillator.

18 Claims, 7 Drawing Sheets

DIGITAL AUTOMATIC GAIN CONTROL CIRCUITS AND METHODS FOR CONTROLLING THE AMPLITUDE OF A TIME-VARYING SIGNAL

BACKGROUND

The present circuits and methods relate to automatic gain control (AGC). AGC circuits stabilize the amplitude of an input signal using a feedback circuit or loop. AGC circuits have been implemented in both analog and digital forms.

The emergence of the mobile telecommunications market has made the desire for small, inexpensive and power efficient radio-frequency (RF) circuit components paramount. One of the major challenges in the design of an efficient and inexpensive communication system is frequency synthesis of a local oscillator signal. Frequency synthesis is usually accomplished using a phase-locked loop (PLL). A PLL generally includes components like a phase detector, an amplifier, and a voltage-controlled oscillator (VCO). A feedback control signal within a closed loop causes the output frequency to be a multiple of a reference frequency. The reference frequency is typically provided by the VCO.

Despite numerous advances, VCOs remain a critical design component in numerous RF communication devices. Important design parameters for VCOs include phase noise, power consumption and frequency range. To date, low-power, low-phase noise VCOs are based on the resonant frequency of an inductor-capacitor (LC) tank circuit.

An example of a Low-Noise, Low-Power Voltage Controlled Oscillator with Automatic Amplitude Control for Wireless Applications was presented by Mihai A. Margarit et al. in June of 1999. See, for example, FIG. 2 of Margarit et al. The feedback circuit or loop is enabled via an analog implementation with a peak detector, a reference voltage generator, a transconductance amplifier and low-pass filters. The peak signal level is compared to the output of the reference to generate an error signal. The error signal voltage is amplified and used as a control signal to increase or decrease the amplitude.

Traditional peak detectors suffer from both bandwidth limitations and matching issues. These limitations increase the amplitude tolerance in comparison to digital methods. A large tolerance places a significant burden on the design of downstream circuits. This burden and the complexity of these circuits increases with signal power.

In addition, the use of traditional peak detectors and transconductance amplifiers introduces phase noise into the output of the VCO. Phase noise directly affects signal jitter, which is undesirable for clock signal applications.

SUMMARY

An embodiment of a gain-control circuit includes a duty cycle detector, an analog-to-digital converter, and a function generator. The gain-control circuit receives input signals from a voltage-controlled oscillator and a target amplitude and generates a control word. The duty cycle detector has a first signal input which is coupled to a first output of the voltage-controlled oscillator, a second signal input which is coupled to a second output of the voltage-controlled oscillator, and an output. The duty cycle detector generates an estimate of a difference of a first voltage present on the first signal input and a second voltage present on the second signal input. The estimate of the difference is forwarded to an input of the analog-to-digital converter. The analog-to-digital converter generates a representation of the difference on an N-bit bus, which is coupled to the function generator. The function generator generates a modified estimate of the amplitude and a control word as a function of the modified estimate and the target amplitude.

An embodiment of a method for controlling the amplitude of a time-varying signal generated by a voltage-controlled oscillator includes the steps of using a duty cycle detector to generate an estimate of the amplitude of a voltage-controlled oscillator, generating a representation of the estimate of the amplitude of the voltage-controlled oscillator, using the representation of the estimate of the amplitude of the voltage-controlled oscillator to generate a corrected estimate, using the corrected estimate as an input to a function generator to determine a measured amplitude of the output of the voltage-controlled oscillator, comparing the measured amplitude with a target amplitude to generate a control word, and using the control word to enable current sources in the voltage-controlled oscillator.

An embodiment of a method for calibrating a voltage-controlled oscillator with a duty cycle detector includes the steps of adjusting a control word coupled to a voltage-controlled oscillator to a maximum value, applying the output of the voltage-controlled oscillator to a duty cycle detector to generate an estimate of the amplitude of the output of the voltage-controlled oscillator, periodically sampling the estimate of the amplitude, calculating a function of a filtered DC voltage, a pseudo NMOS inverter low voltage level, and a supply voltage to generate a modified estimate of the amplitude, and periodically adjusting the control word as a function of a target value and the modified estimate of the amplitude.

The figures and detailed description that follow are not exhaustive. The disclosed embodiments are illustrated and described to enable one of ordinary skill to make and use the circuits and methods for controlling the amplitude of a time-varying signal generated by a voltage-controlled oscillator. Other embodiments, features and advantages of the circuits and methods will be or will become apparent to those skilled in the art upon examination of the following figures and detailed description. All such additional embodiments, features and advantages are within the scope of the circuits and methods as defined in the accompanying claims.

BRIEF DESCRIPTION OF THE FIGURES

The circuits and methods for controlling the amplitude of a time-varying signal generated by a voltage-controlled oscillator can be better understood with reference to the following figures. The components within the figures are not necessarily to scale, emphasis instead being placed upon clearly illustrating the principles of using a duty cycle to generate an estimate of the amplitude, correcting the estimate to generate a measured amplitude and using the measured amplitude and a target amplitude to adjust a control word. Moreover, in the figures, like reference numerals designate corresponding parts throughout the different views.

DETAILED DESCRIPTION

Figure 1:
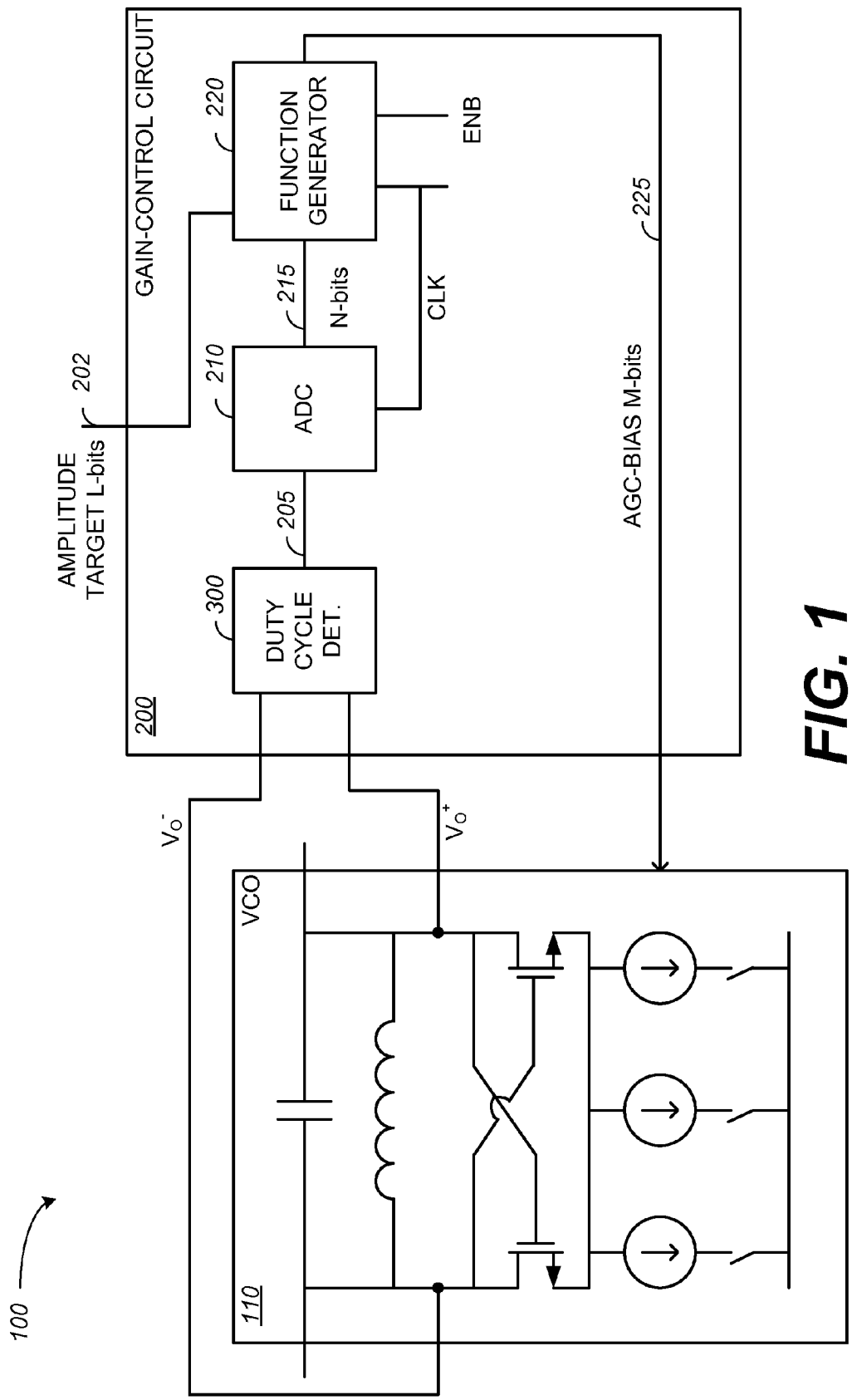
FIG. 1 is a schematic diagram of a voltage-controlled oscillator and an embodiment of a gain-control circuit.

A digital automatic gain-control circuit with improved phase noise and improved clock jitter is implemented in a control loop of a voltage-controlled oscillator (VCO). Although described with particular reference to a negative feedback loop coupled to a voltage-controlled oscillator (VCO), the gain-control circuit can be used in any device or system that has a need to automatically adjust the amplitude of a sinusoidal signal. In an embodiment, the gain-control circuit can be implemented as part of an integrated module that contains other circuit elements, or can be implemented as one or more discrete circuits. The gain-control circuit includes a function generator.

In an embodiment, the function generator can be implemented in hardware. The hardware implementation of the function generator can include any or a combination of the following technologies, which are all well known in the art: discrete electronic components, integrated electronic components, a discrete logic circuit(s) having logic gates for implementing logic functions upon data signals, an application specific integrated circuit having appropriate logic gates, a programmable gate array(s) (PGA), a field programmable gate array (FPGA), etc. In an alternative embodiment, the function generator can be implemented via a combination of a processor and a memory suitable for retaining coded instructions for performing calculations.

The gain-control circuit includes a duty cycle detector, an analog-to-digital converter (ADC) and a function generator. The duty cycle detector generates an output signal that is an estimate of the amplitude of the VCO output. The ADC receives the output signal from the duty cycle detector and generates a digital representation of the same, which is forwarded to the function generator. The function generator generates a modified and/or corrected version of the estimate of the amplitude at the output of the VCO and periodically compares the modified estimate to a target amplitude to generate a control word. The control word is used to enable current sources in the VCO.

In an embodiment, duty cycle detection is accomplished with a multiple stage pseudo NMOS inverter that is AC-coupled to the output of the VCO. A first replica circuit, including a pseudo NMOS inverter with the n-channel field-effect transistor configured as a diode, is used in a calibration process to determine the input voltage that will result in a desired threshold voltage. A second replica circuit is used during the calibration process to determine the low-voltage level of the AC-coupled pseudo NMOS inverter. The output of the final stage of the multiple stage pseudo NMOS inverter is filtered to generate an average output voltage that is an estimate of the amplitude of the VCO output.

The output of the duty cycle detector is forwarded to an analog-to-digital converter, which generates a N-bit representation of the average output voltage. The N-bit representation is coupled to an input of the function generator. The function generator also receives a target amplitude and a clock. The function generator generates a measured or corrected duty cycle as a function of the supply voltage, the low-level voltage and the average output voltage produced by the duty cycle detector. The function generator further calculates a modified amplitude using a trigonometric relation between the measured duty cycle and the amplitude. The modified amplitude is compared with the target amplitude to determine if the control word should be adjusted.

Turning now to the drawings, wherein like reference numerals designate corresponding parts throughout the drawings, reference is made to FIG. 1, which includes a schematic diagram of a circuit 100 including a VCO 110 and a gain-control circuit 200. One having ordinary skill in the art will recognize and understand the construction and operation of the VCO 110, and, as such, implementation details are not described herein. The gain-control circuit 200 receives $Vo^-$ and $Vo^+$ signal outputs from the VCO 110 and a target amplitude on connection 202. The gain-control circuit 200 generates a control word on connection 225. The control word is a function of the amplitude of the VCO output and the target amplitude. The gain-control circuit includes a duty cycle detector 300 that receives the $Vo^-$ and $Vo^+$ signals from the VCO 110 and forwards an estimate of the duty cycle on connection 205 to the ADC 210.

The ADC 210 generates a digital representation of the signal on connection 205 in accordance with a clock input and forwards the digital representation on connection 215 to the function generator 220. In turn, the function generator 220 generates an M-bit control word (labeled as AGC-BIAS in FIG. 1) in accordance with the digital representation of the duty cycle received on connection 215 and the target amplitude received on connection 202. The M-bit control word is used to selectively close the switches in the VCO 110. Each switch adds a respective current source in the tail of the VCO 110. Three current sources are shown for illustrative purposes only. Any desired number of current sources can be controllably added by a gain-control circuit 200 that generates a corresponding integer number of bits in a control word. In addition, the current sources may be configured to provide different current values.

Figure 2:
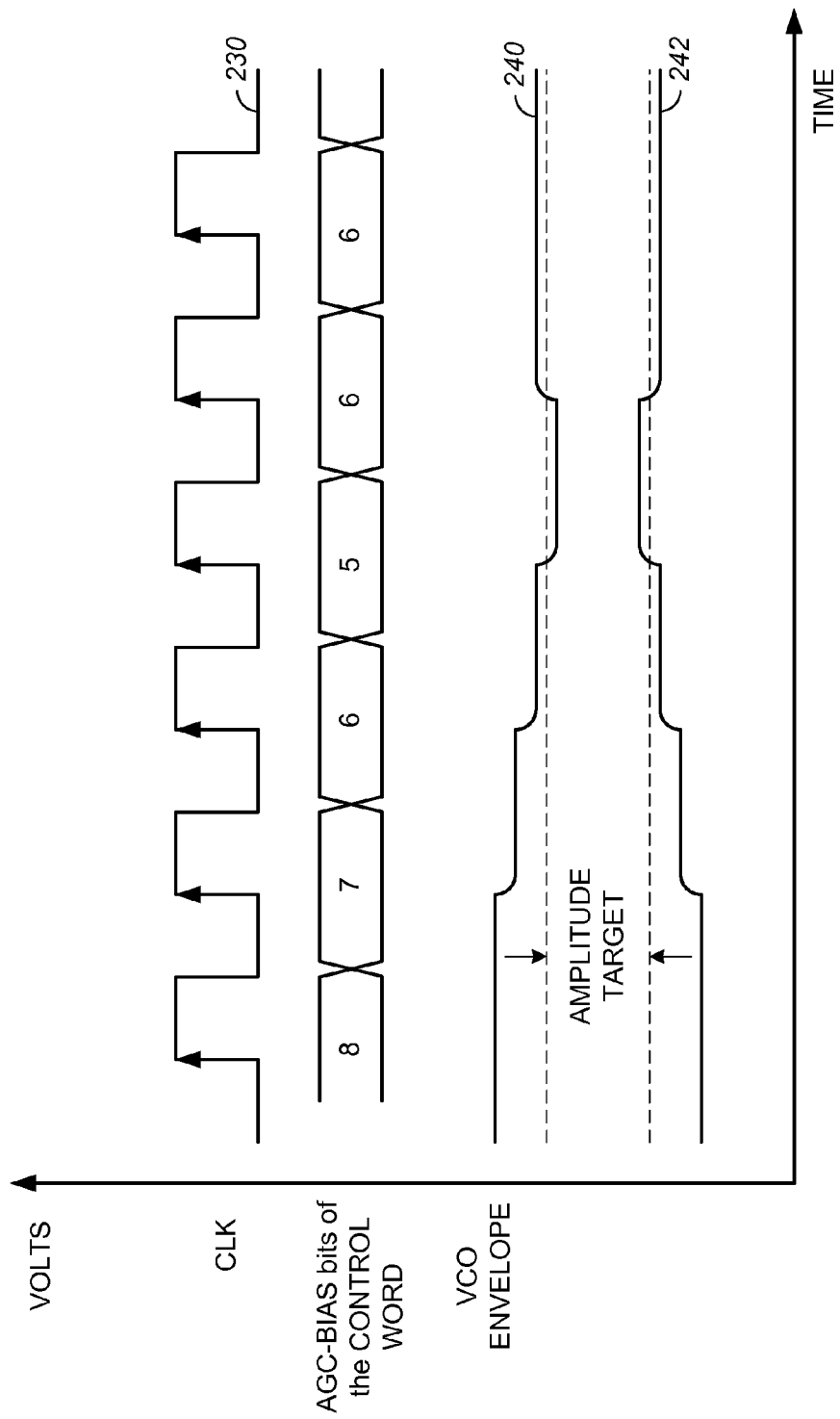
FIG. 2 is a timing diagram illustrating relationships between various signals in the schematic diagram of FIG. 1.

FIG. 2 is a timing diagram illustrating relationships between various signals in the schematic diagram of FIG. 1. The timing diagram shows time along the abscissa or horizontal axis and relative voltage along the ordinate or vertical axis. A clock signal is represented by signal trace 230. An upper boundary of the VCO envelope is illustrated by trace 240. A lower boundary of the VCO envelope is illustrated by trace 242. The dashed lines depict a target amplitude signal.

The VCO amplitude has initially been set to a maximum by setting each of the available bits (e.g., eight bits) of the control word. On the rising edge of the clock signal, a voltage proportional to the VCO amplitude, such as the voltage on connection 205 of the gain-control circuit 200 is sampled by ADC 210. The sampled voltage is converted by ADC 210 to a digital word that is forwarded on connection 215 to the function generator 220. The function generator 220 generates a modified estimate of the amplitude represented by the digital word on connection 215. On the falling edge of the clock signal, the function generator 220 updates the control word in accordance with a comparison of the modified estimate of the amplitude and the target amplitude. In the example embodiment, as the AGC-BIAS bits are decremented, the VCO envelope approaches the target amplitude. After the fourth rising edge, the VCO envelope crosses the amplitude target. On the next falling edge, the function generator responds by incrementing the AGC-BIAS bits of the control word. Thereafter, further adjustments of the control word are made depending on the application. In some applications, once the VCO envelope crosses the amplitude target further adjustments of the control word may not be applied as long as the VCO envelope tracks the target amplitude. In some other applications, continuous (i.e., periodic) adjustments may be applied.

Figure 3:
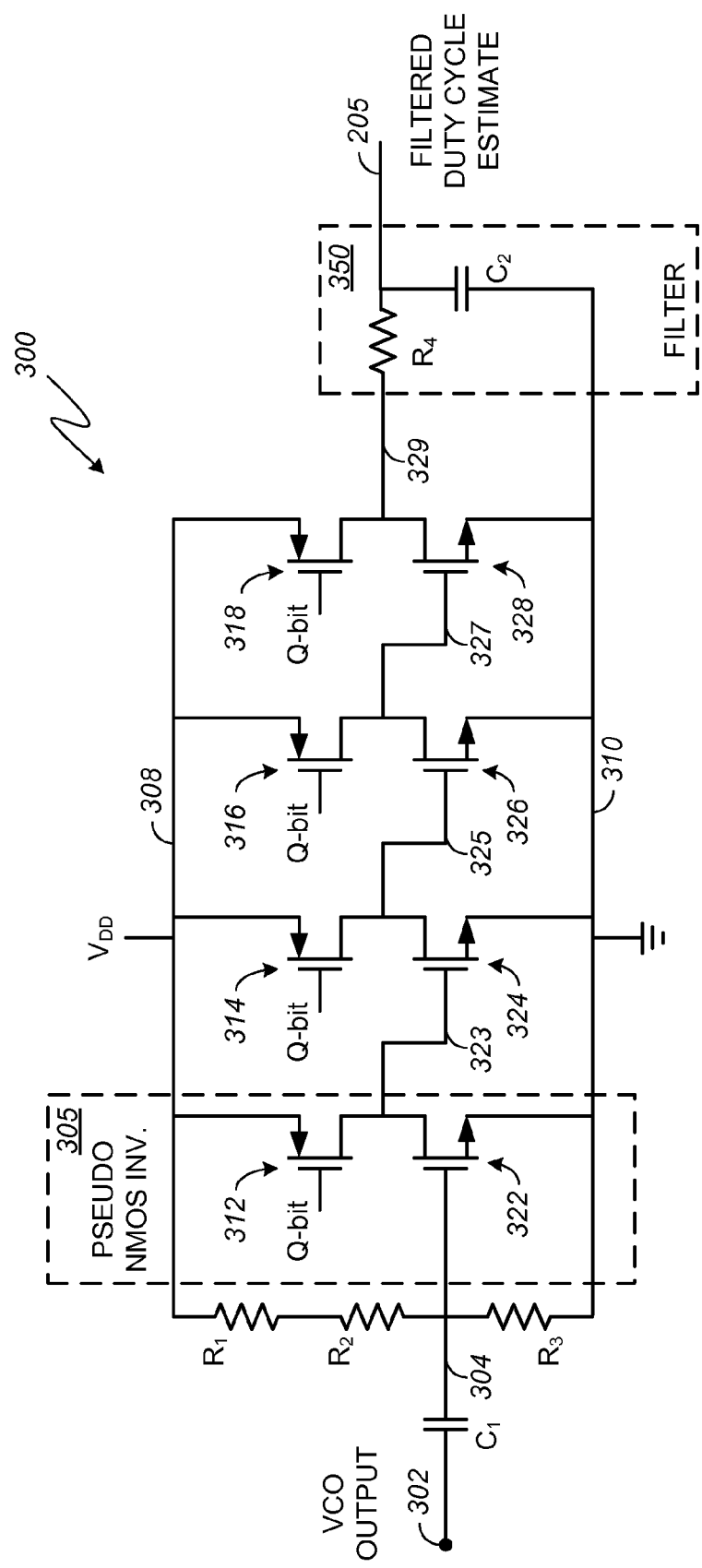
FIG. 3 is a schematic diagram illustrating an embodiment of a portion of the duty cycle detector of FIG. 1.

FIG. 3 is a schematic diagram illustrating an embodiment of the duty cycle detector 300 of FIG. 1. The VCO output signals are node 302. A DC-blocking capacitor C1, forwards the sinusoidal VCO output on connection 304 to the input resistors and the pseudo NMOS inverter 305. The resistance values of the input resistors $R_1$, $R_2$, and $R_3$ offset the voltage on connection 304 to an AC-coupled level so that the output of the duty cycle detector 300 does not swing to electrical ground. The pseudo NMOS inverter 305 includes a p-channel FET 312 and an n-channel FET 322. The gate of the n-channel FET 322 receives the DC-input voltage. The drain of the n-channel FET 322 is coupled to connection 310, which is coupled to electrical ground. When the gate of the p-channel FET 312 is coupled to a Q-bit having a voltage below a digital low value, the p-channel FET 312 operates in a triode mode and current flows from connection 308, which is coupled to a supply voltage VDD, through the drain of the p-channel FET 312 to the connection 323. The DC-input voltage on connection 304 in conjunction with the threshold voltage of the pseudo NMOS inverter 305 determines the duty cycle of the voltage on connection 323.

FIG. 3 is a schematic diagram illustrating an embodiment of a portion of the duty cycle detector 300 of FIG. 1. The VCO output signals (Vo$^-$ and Vo$^+$) are coupled to respective instances of the duty cycle detector 300 via node 302. A DC-blocking capacitor C1, forwards the sinusoidal VCO output on connection 304 to the input resistors and the pseudo NMOS inverter 305. The resistance values of the input resistors $R_1$, $R_2$, and $R_3$ offset the voltage on connection 304 to an AC-coupled level so that the output of the duty cycle detector 300 does not swing to electrical ground. The pseudo NMOS inverter 305 includes a p-channel FET 312 and an n-channel FET 322. The gate of the n-channel FET 322 receives the DC-input voltage. The drain of the n-channel FET 322 is coupled to connection 310, which is coupled to electrical ground. When the gate of the p-channel FET 312 is coupled to a Q-bit having a voltage below a digital low value, the p-channel FET 312 operates in a triode mode and current flows from connection 308, which is coupled to a supply voltage VDD, through the drain of the p-channel FET 312 to the connection 323. The DC-input voltage on connection 304 in conjunction with the threshold voltage of the pseudo NMOS inverter 305 determines the duty cycle of the voltage on connection 323.

A third stage of the multiple-stage pseudo NMOS inverter includes a p-channel FET 316 and an n-channel FET 326. The gate of the n-channel FET 326 receives the voltage on connection 325. The drain of the n-channel FET 326 is coupled to connection 310, which is coupled to electrical ground. When the gate of the p-channel FET 316 is coupled to a Q-bit having a voltage below a digital low value, the p-channel FET 316 operates in a triode mode and current flows from connection 308, which is coupled to a supply voltage VDD, through the drain of the p-channel FET 316 to the connection 327. The voltage on connection 325 in conjunction with the threshold voltage of the third-stage pseudo NMOS inverter determines the duty cycle of the voltage on connection 327.

A fourth stage of the multiple-stage pseudo NMOS inverter includes a p-channel FET 318 and an n-channel FET 328. The gate of the n-channel FET 328 receives the voltage on connection 327. The drain of the n-channel FET 328 is coupled to connection 310, which is coupled to electrical ground. When the gate of the p-channel FET 318 is coupled to a Q-bit having a voltage below a digital low value, the p-channel FET 318 operates in a triode mode and current flows from connection 308, which is coupled to a supply voltage VDD, through the drain of the p-channel FET 318 to the connection 329. The voltage on connection 329 in conjunction with the threshold voltage of the fourth-stage pseudo NMOS inverter determines the duty cycle of the voltage on connection 329.

The output of the multiple-stage pseudo NMOS inverter is forwarded to filter 350, which includes a series coupled resistor $R_4$ and a shunt capacitor $C_2$. The filter 350 forwards the average value of the voltage on connection 329 via connection 205 to the ADC 210 (FIG. 1).

Figure 4:
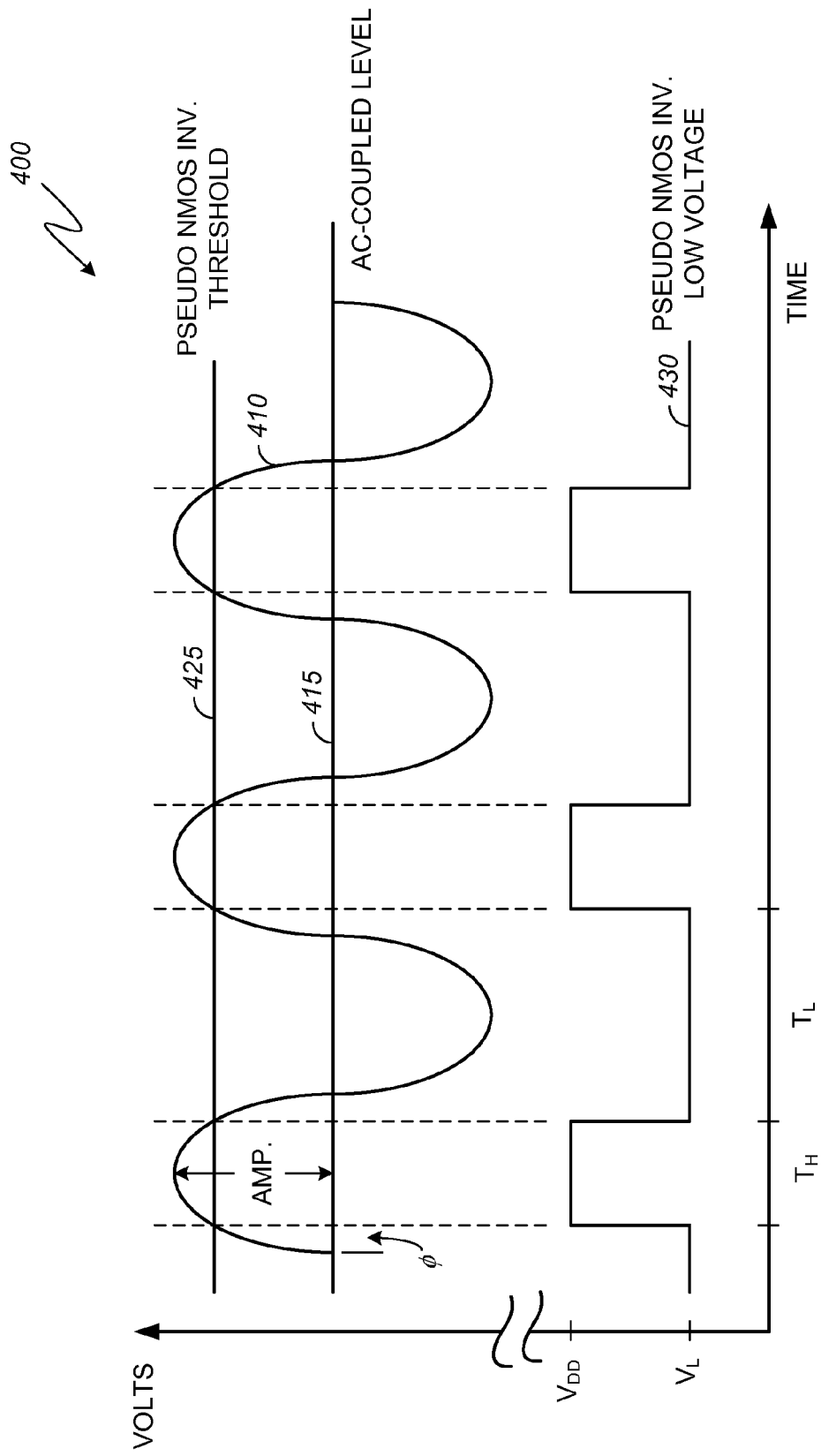
FIG. 4 is a schematic diagram illustrating the relationship between the VCO output signal, the AC-coupled voltage offset, a threshold level and the output signal generated by the duty cycle detector of FIG. 1.

FIG. 4 is a schematic diagram illustrating the relationship between the VCO output signal, the AC-coupled voltage offset, a threshold level and the output signal generated by the duty cycle detector 300 of FIG. 1. The timing diagram in FIG. 4 shows time along the abscissa or horizontal axis and relative voltage along the ordinate or vertical axis. The VCO output signal is represented by signal trace 410. The VCO output signal is sinusoidal and varies about the AC-coupled level (i.e., the voltage on connection 304 coupled to the input of the pseudo NMOS inverter 305 (FIG. 3)). The pseudo NMOS inverter threshold or trigger voltage is represented by trace 425. As shown by trace 430, the output of the multi-stage pseudo NMOS inverter remains at an inverter low-voltage level when the VCO output signal is below the threshold or trigger voltage. When the VCO output signal exceeds the threshold or trigger voltage, the trace 430 shifts to a higher voltage than the inverter low-voltage level. When the VCO output signal falls below the threshold or trigger voltage, the output of the multi-stage pseudo NMOS inverter returns to the low-voltage level. Thus, the filtered version of the voltage on connection 329, which is forwarded to the ADC 210 is proportional to the duty cycle of the trace 430. As the threshold or trigger voltage of the pseudo NMOS inverter increases, the duty cycle decreases and the filtered voltage decreases. As the threshold or trigger voltage of the pseudo NMOS inverter decreases, the duty cycle and the filtered voltage both increase.

An estimate of the maximum VCO voltage (i.e., an amplitude estimate) can be calculated from the filtered output of the duty cycle detector 300. Since the pseudo NMOS inverter stages do not swing to electrical ground, the filtered output of the duty cycle detector 300 is corrected as shown in Equation 1 and Equation 2. The variables for solving Equation 1 and Equation 2 are shown in association with the trace 430.

$$AVG = [V_{DD} - V_L]\left(\frac{T_H}{T_H + T_L}\right) + V_L = [V_{DD} - V_L](\text{Duty}) + V_L \quad \text{Eq. 1}$$

$$\text{Therefore, Duty\_corrected} = \frac{AVG - V_L}{V_{DD} - V_L} \quad \text{Eq. 2}$$

The VCO output at time t (i.e., when the pseudo NMOS inverter triggers) can be determined from Equation 3. The variables for solving Equation 3 through Equation 6 are shown in association with signal trace 410, and include the AC-coupled level 415 and the pseudo NMOS inverter threshold voltage 425.

$$VCO(t) = AMP \cdot \sin(\phi) + \text{AC\_coupled} \quad \text{Eq. 3}$$

$$\sin(\phi) = \frac{Thresh. - \text{AC\_coupled}}{AMP.} \quad \text{Eq. 4}$$

$$\phi = a\sin\left[\frac{Thresh. - \text{AC\_coupled}}{AMP.}\right] \quad \text{Eq. 5}$$

-continued $$\text{Duty\_corrected} = \frac{2[90-\phi]}{360} = \frac{2\left(90 - a\sin\left[\frac{Thresh.-AC\_coupled}{AMP.}\right]\frac{180}{\pi}\right)}{360} \quad \text{Eq. 6}$$

Thus, a relationship can be established between the corrected duty cycle and the amplitude of the VCO output.

Figure 5:
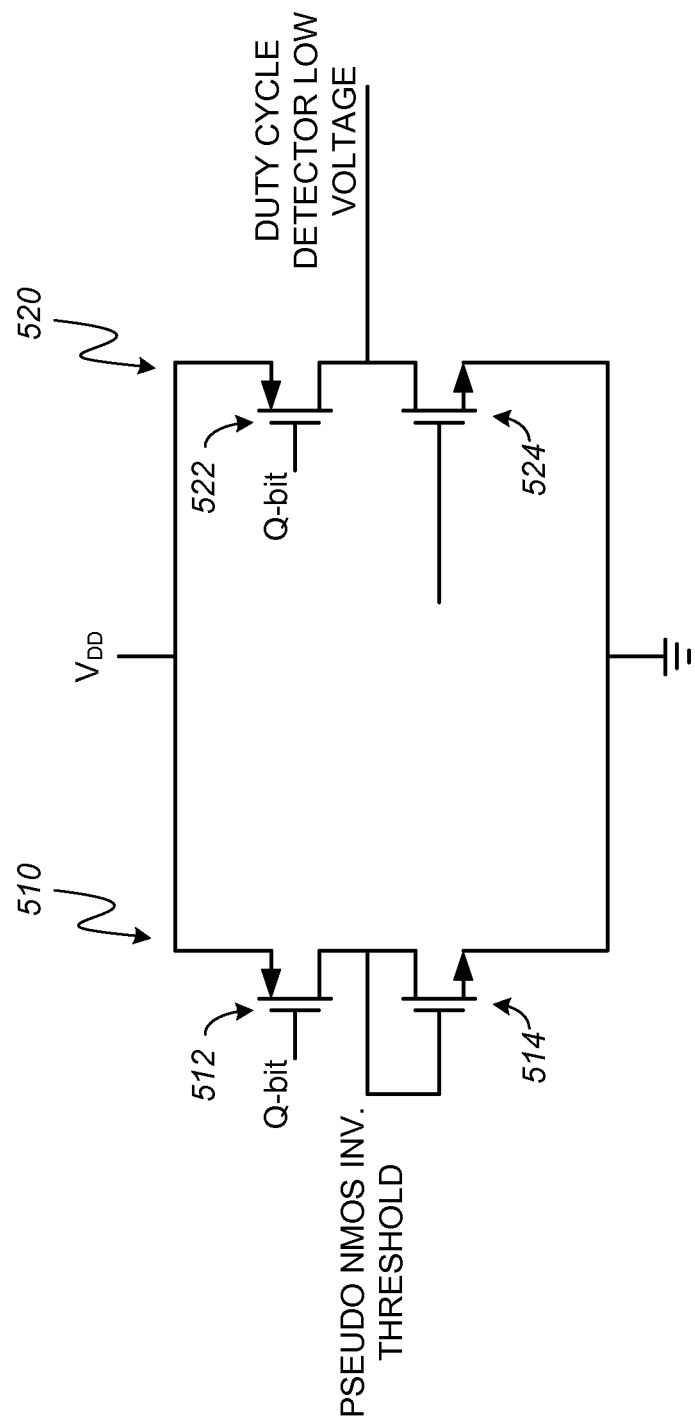
FIG. 5 is a schematic diagram illustrating respective embodiments of first and second replica circuits for adjusting the threshold level and an output signal low voltage level of the duty cycle detector of FIG. 1.

To improve the accuracy of the measured amplitude, replica circuits, as shown in FIG. 5, are created on the same die using the same semiconductor manufacturing process that was used for generating the semiconductor devices of the multiple-stage pseudo NMOS inverter. FIG. 5 is a schematic diagram illustrating respective embodiments of a first replica circuit 510 and second replica circuit 520 for adjusting the threshold level and an output signal low voltage level of the duty cycle detector 300 of FIG. 1.

As illustrated in FIG. 5, the first replica circuit 510 includes a p-channel FET 512 and an n-channel FET 514. The gate and the source of the n-channel FET 514 are coupled to each other and to the drain of the p-channel FET 512. The source of p-channel FET 512 is coupled to a supply voltage $V_{DD}$. The drain of the n-channel FET 514 is coupled to electrical ground. The voltage on the gate of the p-channel FET 512 (labeled Q-bit) can be adjusted until a desired inverter threshold voltage is achieved. The first replica circuit 510 is used to adjust the pseudo NMOS inverter threshold by adjusting the Q-bit inputs to the multiple-stage pseudo NMOS inverter. The adjustment of the pseudo NMOS inverter in this manner reduces process, voltage and temperature errors. The measured pseudo NMOS inverter threshold can be stored for use in solving Equation 4 through Equation 6.

The second replica circuit 520 determines the low-level output voltage of the duty cycle detector 300. The second replica circuit 520 includes a p-channel FET 522 and an n-channel FET 524. The drain of the p-channel FET 522 is coupled to the source of the n-channel FET 524. The source of p-channel FET 522 is coupled to the supply voltage $V_{DD}$. The drain of the n-channel FET 524 is coupled to electrical ground. The voltage on the gate of the p-channel FET 512 (i.e., the input labeled Q-bit) is set to the level that generated the desired inverter threshold voltage in the first replica circuit 510. The gate of the n-channel FET 524 is coupled to a voltage, which further adjusts the low-level output of multiple-stage pseudo NMOS inverter.

Figure 6:
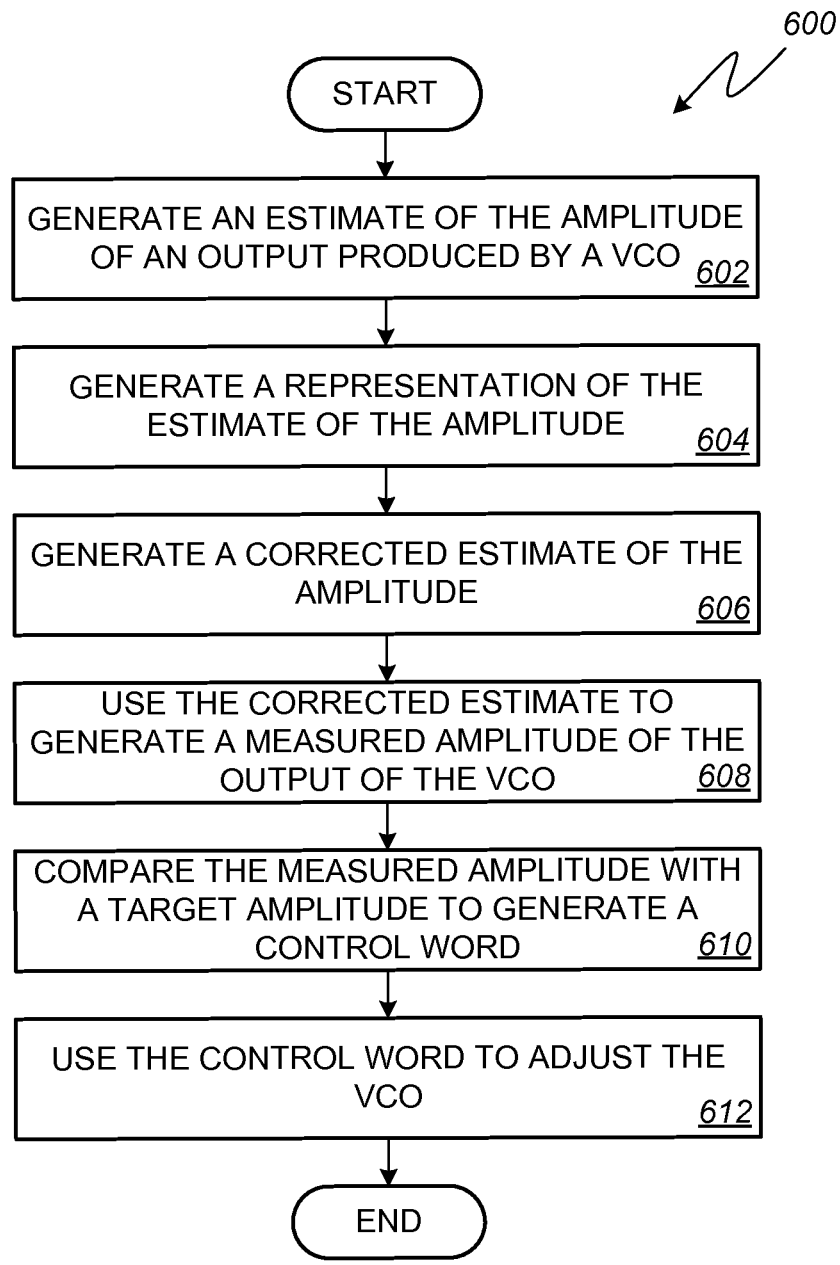
FIG. 6 is a flow chart illustrating an embodiment of a method for controlling the amplitude of the VCO of FIG. 1.

FIG. 6 is a flow chart illustrating an embodiment of a method 600 for controlling the amplitude of the VCO of FIG. 1. The method 600 begins with block 602, where an estimate of the amplitude of an output produced by a VCO is generated by a duty cycle detector 300.

In block 604, a representation of the estimate of the amplitude generated in block 602 is generated by an analog-to-digital converter 210.

In block 606, a corrected or modified estimate of the representation of the estimate of the amplitude generated in block 604 is calculated in the function generator 220 or in another suitable processor.

In block 608, a measured amplitude of the output of the VCO is generated from the corrected or modified estimate. The function generator 220, or another suitable processor, is configured to calculate the measured amplitude.

In block 610, the measured amplitude determined in block 608 is compared with a target amplitude to generate a control word. As also described above, the function generator 220, or another suitable processor, is configured to compare the measured amplitude with the target amplitude to adjust the control word.

In block 612, the control word generated in block 610 is used to adjust the VCO. The individual AGC-bias bits of the control word can be used to selectively close a switch coupled in series to a respective current source in a tail of the VCO to adjust the amplitude of the VCO output. Furthermore, the individual AGC-bias bits of the control word can be weighted and coupled to a correspondingly sized current source in the VCO.

The functions and operations associated with block 602 through block 612 can be repeated as may be desired to control the output of a VCO.

Figure 7:
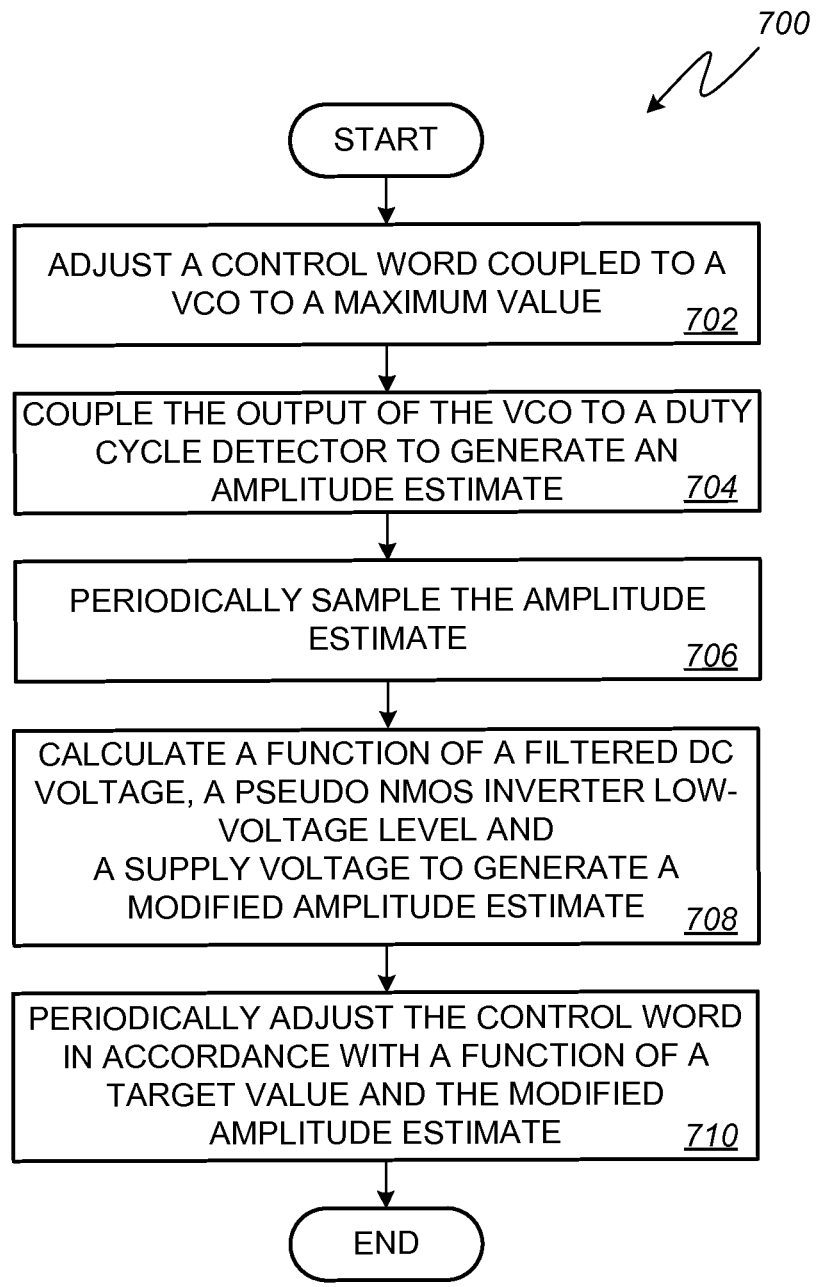
FIG. 7 is a flow chart illustrating an embodiment of a method for calibrating the amplitude of a VCO with a duty cycle detector and a function generator.

FIG. 7 is a flow chart illustrating an embodiment of a method 700 for calibrating the amplitude of a VCO with a duty cycle detector 300 and a function generator 220. The method 700 begins with block 702, where a control word coupled to VCO is set to a maximum value.

In block 704, the output of the VCO is coupled to a duty detector to generate an amplitude estimate.

In block 706, the amplitude estimate is periodically sampled to generate a digital representation of the amplitude.

In block 708, a function generator, or other suitably configured processor, is used to calculate a function of a filtered DC voltage, a pseudo NMOS inverter low-voltage level and a supply voltage to generate a measured amplitude.

In block 710, a function generator, or other suitably configured processor, is used to periodically adjust the control word in accordance with a function of a target amplitude and the measured amplitude generated in block 708.

The functions and operations associated with block 702 through block 708 can be repeated as may be desired to calibrate the output of a VCO.

While various example embodiments of the circuits and methods for controlling the amplitude of a voltage-controlled oscillator have been described, it will be apparent to those of ordinary skill in the art that many more embodiments and implementations are possible that are within the scope of this disclosure. Accordingly, the described circuits and methods for controlling the amplitude of a time-varying signal with a duty cycle detector are not to be restricted or otherwise limited except in light of the attached claims and their equivalents.

What is claimed is:

1. A gain-control circuit, comprising:
a duty cycle detector having a first signal input coupled to a first output of a voltage-controlled oscillator, a second signal input coupled to a second output of the voltage-controlled oscillator, and an output, the duty cycle detector including a resistively loaded multiple stage pseudo NMOS inverter and arranged to generate an estimate of one of a first voltage present on the first signal input and a second voltage present on the second signal input;
an analog-to-digital converter having an input coupled to the output of the duty cycle detector and an N-bit bus, the analog-to-digital converter generating a representation of the estimate on the N-bit bus; and
a function generator coupled to the N-bit bus and arranged to receive a target value, the function generator configured to generate a corrected value as a function of the representation on the N-bit bus and to generate a control word in response to the corrected value and the target value.

2. The gain-control circuit of claim 1, wherein the control word is coupled to current sources in the voltage-controlled oscillator.

3. The gain-control circuit of claim 2, wherein the control word includes an integer number of bits corresponding in a one-to-one relationship with respective current sources coupled to the drains of transistors in the voltage-controlled oscillator.

4. The gain-control circuit of claim 1, wherein the duty cycle detector is coupled to the voltage-controlled oscillator by a capacitor.

5. The gain-control circuit of claim 1, wherein the duty cycle detector comprises an output filter that generates a DC voltage.

6. The gain-control circuit of claim 1, wherein the function generator generates an amplitude as a function of a threshold voltage, a coupled voltage offset, and a target amplitude.

7. The gain-control circuit of claim 6, wherein the threshold voltage is adjusted with a first replica circuit.

8. The gain-control circuit of claim 1, wherein a measured value is determined as a function of a filtered DC voltage, a pseudo NMOS inverter low voltage level, and a supply voltage.

9. The gain-control circuit of claim 8, wherein the pseudo NMOS inverter low voltage level is adjusted with a second replica circuit.

10. The gain-control circuit of claim 1, wherein the function generator generates an amplitude in accordance with a trigonometric function.

11. A method for controlling the amplitude of a voltage-controlled oscillator coupled to a gain-control circuit, the method comprising:
    using a duty cycle detector to generate an estimate of the amplitude of a voltage-controlled oscillator, wherein using the duty cycle detector includes using a multiple stage pseudo NMOS inverter;
    generating a representation of the estimate of the amplitude of the voltage-controlled oscillator;
    using the representation of the estimate of the amplitude of the voltage-controlled oscillator to generate a corrected estimate;
    using the corrected estimate as an input to a function generator to determine a measured amplitude of the output of the voltage-controlled oscillator;
    comparing the measured amplitude with a target amplitude to generate a control word; and
    using the control word to enable current sources in the voltage-controlled oscillator.

12. The method of claim 11, wherein using a duty cycle detector to generate an estimate of the amplitude of a voltage-controlled oscillator includes coupling the duty cycle detector to the voltage-controlled oscillator with a capacitor.

13. The method of claim 11, wherein using a duty cycle detector to generate an estimate of the amplitude of a voltage-controlled oscillator includes using a resistor network to determine an AC-coupled voltage level.

14. The method of claim 11, wherein using a duty cycle detector to generate an estimate of the amplitude of a voltage-controlled oscillator includes using a first replica circuit to adjust a threshold voltage.

15. The method of claim 11, further comprising coupling an $N^{th}$ stage output of the multiple stage pseudo NMOS inverter to a filter to generate a filtered version of the estimate of the amplitude of the voltage-controlled oscillator.

16. The method of claim 15, wherein generating a corrected estimate includes calculating a function of the filtered version of the estimate of the amplitude of the voltage-controlled oscillator, a supply voltage and a pseudo NMOS inverter low voltage level.

17. The method of claim 16, wherein the pseudo NMOS inverter low voltage level is measured by applying a control signal to a second replica circuit.

18. A method for calibrating a voltage-controlled oscillator with a duty cycle detector, the method comprising:
    adjusting a control word coupled to a voltage-controlled oscillator to a maximum value;
    applying the output of the voltage-controlled oscillator to a duty cycle detector to generate an estimate of the amplitude of the output of the voltage-controlled oscillator;
    periodically sampling the estimate of the amplitude;
    calculating a function of a filtered DC voltage, a pseudo NMOS inverter low voltage level, and a supply voltage to generate a modified estimate of the amplitude; and
    periodically adjusting the control word as a function of a target value and the modified estimate of the amplitude.

* * * * *